(12) United States Patent
Ohashi et al.

(10) Patent No.: US 10,186,559 B2
(45) Date of Patent: Jan. 22, 2019

(54) ORGANIC ELECTROLUMINESCENCE MODULE AND INFORMATION DEVICE

(71) Applicant: Konica Minolta, Inc., Tokyo (JP)

(72) Inventors: Seiji Ohashi, Kokubunji (JP); Natsuki Yamamoto, Kawasaki (JP)

(73) Assignee: KONICA MINOLTA, INC., Tokyo (JP)

( * ) Notice: Subject to any disclaimer, the term of this patent is extended or adjusted under 35 U.S.C. 154(b) by 157 days.

(21) Appl. No.: 15/122,063

(22) PCT Filed: Mar. 20, 2015

(86) PCT No.: PCT/JP2015/058453
§ 371 (c)(1),
(2) Date: Aug. 26, 2016

(87) PCT Pub. No.: WO2015/151855
PCT Pub. Date: Oct. 8, 2015

(65) Prior Publication Data
US 2017/0012088 A1   Jan. 12, 2017

(30) Foreign Application Priority Data
Mar. 31, 2014  (JP) .................................. 2014-071547

(51) Int. Cl.
*G01D 11/28* (2006.01)
*H01L 27/32* (2006.01)
(Continued)

(52) U.S. Cl.
CPC .......... *H01L 27/3239* (2013.01); *F21V 3/049* (2013.01); *H01L 27/3204* (2013.01); *H01L 27/3232* (2013.01); *F21Y 2115/15* (2016.08)

(58) Field of Classification Search
CPC ............ H01L 27/3223; H01L 27/3239; H01L 27/3246; H01L 27/3276; H01L 51/5284; F21Y 2115/15; F21V 3/049
See application file for complete search history.

(56) References Cited

U.S. PATENT DOCUMENTS 9,876,057 B2 *   1/2018   Omata ................ H01L 51/5284
2016/0254455 A1 *  9/2016  Wang .................. H01L 51/5234
                                                                438/23
(Continued)

FOREIGN PATENT DOCUMENTS

JP     H03069557 U     7/1991
JP     2001/167881 *   6/2001
(Continued)

OTHER PUBLICATIONS

International Search Report dated Jun. 16, 2015 for PCT/JP2015/058453.

*Primary Examiner* — Ali Alavi
(74) *Attorney, Agent, or Firm* — Lucas & Mercanti, LLP

(57) ABSTRACT

An object of the invention is to provide an organic electroluminescence module having light-emitting units capable of keeping power consumption low and to provide an information device having such a module. The organic electroluminescence module of the invention includes a plurality of light-emitting units that are electrically connected to one another and each have a light-emitting region corresponding to a design to be displayed by light emission.

19 Claims, 5 Drawing Sheets

(51) Int. Cl.
*F21V 3/04* (2018.01)
*F21Y 115/15* (2016.01)

(56) References Cited

U.S. PATENT DOCUMENTS

2016/0365341 A1* 12/2016 Then .................... H01L 27/0629
2017/0154943 A1* 6/2017 Yang ................... H01L 27/3276
2018/0040680 A1* 2/2018 Cai ..................... H01L 27/3262

FOREIGN PATENT DOCUMENTS

| JP | 2001167881 A | 6/2001 |
| JP | 2002280172 A | 9/2002 |
| JP | 2003014505 A | 1/2003 |
| JP | 2003178875 A | 6/2003 |
| JP | 2006049853 A | 2/2006 |
| JP | 2012028335 A | 2/2012 |
| JP | 2012194291 A | 10/2012 |

* cited by examiner

ORGANIC ELECTROLUMINESCENCE MODULE AND INFORMATION DEVICE

CROSS REFERENCE TO RELATED APPLICATION

This Application is a 371 of PCT/JP2015/058453 filed on Mar. 20, 2015 which, in turn, claimed the priority of Japanese Application No. 2014-071547 filed on Mar. 31, 2014, both applications are incorporated herein by reference.

TECHNICAL FIELD

The present invention relates to an organic electroluminescence module and an information device including the same. More specifically, the present invention relates to an organic electroluminescence module having a plurality of icon display regions and to an information device including the same and having a touch detection function.

BACKGROUND ART

Conventional planar light sources include light guiding panel-equipped light emitting diodes (hereinafter abbreviated as LEDs) and organic light emitting diodes (hereinafter abbreviated as OLEDs) based on the phenomenon of organic electroluminescence (EL).

Light guiding panel-equipped LED light sources have rapidly come into use as general lights and, for example, from around 2008, as backlights for main displays (such as liquid crystal displays) of smart devices (smartphones and tablets), which gain widespread use.

Such LED light sources are used as backlights not only for main displays but also for common function key buttons (what are called software buttons) provided at lower parts of smart devices.

In some cases, for example, such common function key buttons are provided with three marks "home" (indicated by a symbolic mark representing a house), "return" (indicated by an arrow mark or the like), and "menu" (indicated by a three-line mark or the like).

In order to improve visibility, a light guiding panel having a deflection pattern, which is formed in advance depending on the pattern to be displayed, is used for the display on such a common function key button. Light emitted from an LED light source is incident on the end of the light guiding panel, and the incident light is deflected by the deflection pattern to exit in the normal direction of the light guiding panel. In this way, the light is output in a predetermined pattern from the front side of the light guiding panel, so that the emitted light appears in the pattern when the light guiding panel is viewed from the front side (see, for example, Patent Literature 1).

Unfortunately, such a system using a light guiding panel has a problem in that the light incident on the light guiding panel from the LED light source partially leaks from some parts other than the predetermined pattern, so that the efficiency of use of the LED emission is low while power consumption is high.

CITATION LIST

Patent Literature

Patent Literature 1: JP 2012-194291 A

SUMMARY OF INVENTION

Technical Problem

The present invention has been accomplished in view of the above problems and circumstances, and an object of the present invention is to provide an organic electroluminescence module having light-emitting units capable of keeping power consumption low and to provide an information device including such a module.

Solution to Problem

As a result of intensive studies to solve the above problems, the inventors have found that a plurality of light-emitting units electrically connected to one another can form an organic electroluminescence module with low power consumption.

Specifically, the object of the present invention is achieved by the following measures.

1. An organic electroluminescence module including a plurality of light-emitting units that are electrically connected to one another and each have a light-emitting region corresponding to a design to be displayed by light emission.

2. The organic electroluminescence module according to Item. 1, wherein the plurality of light-emitting units include a light-emitting unit with the lowest emission luminance and a light-emitting unit with the highest emission luminance, wherein the lowest emission luminance is 80% or more of the highest emission luminance.

3. The organic electroluminescence module according to Item. 1 or 2, wherein the plurality of light-emitting units include a light-emitting unit with the smallest area of light-emitting region and a light-emitting unit with the largest area of light-emitting region, wherein the smallest area is 80% or more of the largest area.

4. The organic electroluminescence module according to any one of Items. 1 to 3, wherein the light-emitting regions of the plurality of light-emitting units are icon display regions.

5. The organic electroluminescence module according to Item. 3, wherein the light-emitting region of at least one of the plurality of light-emitting units further includes a dummy light-emitting region in addition to an icon display region, wherein the icon display region and the dummy light-emitting region have a total area equal to the area of the light-emitting region of one of other light-emitting units.

6. The organic electroluminescence module according to anyone of Items. 1 to 5, further comprising a cover glass having printed patterns corresponding to patterns of the icon display regions.

7. The organic electroluminescence module according to any one of Items. 1 to 6, wherein the plurality of light-emitting regions are formed by batch patterning with light at a specific wavelength.

8. The organic electroluminescence module according to any one of Items. 1 to 7, wherein the plurality of light-emitting units are electrically connected in series.

9. An information device including the organic electroluminescence module according to any one of Items. 1 to 8.

10. An information device including a main display screen and at least one sub display screen, wherein the sub display screen includes the organic electroluminescence module according to any one of Items. 1 to 8 as a component.

Advantageous Effects of Invention

The measures according to the present invention described above makes it possible to provide an organic electroluminescence module having light-emitting units capable of keeping power consumption low and to provide an information device including such a module.

The technical features of the organic electroluminescence module according to the present invention and the mechanism of how advantageous effects are produced by the technical features will be described below.

The organic electroluminescence module of the present invention has the following features: it has a plurality of light-emitting units, and each light-emitting unit has a light-emitting region corresponding to the design to be displayed by light emission. Therefore, the organic electroluminescence module of the present invention allows only the necessary parts to emit light so that power consumption can be saved in contrast to a system using a light guiding panel or using the whole of an organic electroluminescence module as a light-emitting unit.

DESCRIPTION OF EMBODIMENTS

Figure 1:
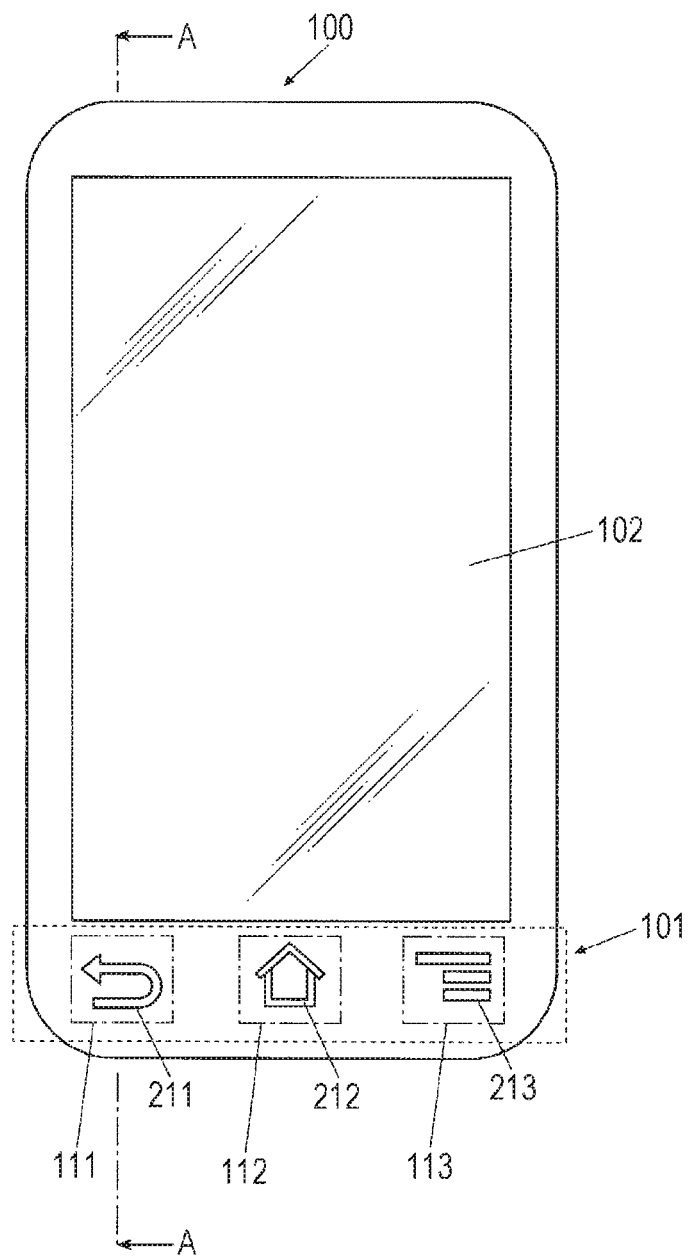
FIG. 1 is a schematic diagram showing an example of an information device including an organic electroluminescence module of the present invention.

The organic electroluminescence module of the present invention includes a plurality of light-emitting units that are electrically connected to one another and each have a light-emitting region corresponding to a design to be displayed by light emission. These features are technical features common to the aspects of the present invention according to claims 1 to 10.

In an embodiment of the present invention, the plurality of light-emitting units include a light-emitting unit with the lowest emission luminance and a light-emitting unit with the highest emission luminance, wherein the lowest emission luminance is preferably 80% or more of the highest emission luminance. In this case, the emitted light can be extracted with high efficiency without luminance unevenness between the light-emitting units.

In another embodiment, the plurality of light-emitting units include a light-emitting unit with the smallest area of light-emitting region and a light-emitting unit with the largest area of light-emitting region, wherein the smallest area is preferably 80% or more of the largest area. In this case, when the same light-emitting elements are used in the plurality of light-emitting units, it is easy to allow the light-emitting units to have the same current density.

In an embodiment of the present invention, the light-emitting regions of the plurality of light-emitting units are preferably icon display regions.

In another embodiment, the light-emitting region of at least one of the plurality of light-emitting units preferably has a dummy light-emitting region in addition to the icon display region, wherein the icon display region and the dummy light-emitting region preferably have a total area equal to the area of the light-emitting region of one of the other light-emitting units. In this case, it is easy to allow a plurality of icon display regions to have the same area even when the areas of the icon display regions are predetermined.

The organic electroluminescence module of the present invention preferably further includes a cover glass having printed patterns corresponding to the patterns of the plurality of icon display regions. In this case, the patterns of the emitted light from the icon display regions can be made clearer and sharper. In addition, when a dummy light-emitting region is provided, the appearance of the dummy light-emitting region may be kept from being displayed.

In an embodiment of the present invention, the plurality of light-emitting regions are preferably formed by batch patterning with light at a specific wavelength, so that cost reduction and process simplification can be achieved.

In a preferred embodiment of the present invention, the plurality of light-emitting units are electrically connected in series.

The organic electroluminescence module of the present invention is preferably installed in an information device.

The organic electroluminescence module of the present invention is preferably installed in an information device including a main display screen and at least one sub display screen and preferably installed as a component of the sub display screen in the information device.

Hereinafter, the present invention, the elements of the present invention, and embodiments and modes for carrying out the present invention will be described in detail. In the description, the word to used to indicate numerical ranges means to include the values before and after it as the lower and upper limits.

«Organic Electroluminescence Module and Information Device»

The organic electroluminescence module includes a plurality of light-emitting units that are electrically connected to one another and each have a light-emitting region corresponding to a design to be displayed by light emission.

In the present invention, the term "light-emitting unit" refers to a light-emitting device including at least the organic electroluminescence element described below and serving as a component (unit or part) of the organic electroluminescence module.

FIG. 1 is a schematic diagram showing an example of an information device including the organic electroluminescence module of the present invention.

An information device 100 according to the present invention includes an organic electroluminescence module (101) (sub display screen) with a touch detection function, a liquid crystal display screen 102 (main display screen), and other components. The liquid crystal display screen 102 may be one conventionally known in the art.

FIG. 1 shows that the light-emitting regions of a plurality of light-emitting units in the organic electroluminescence module (hereinafter also referred to as the organic EL module) 101 of the present invention emit light, so that the light emitted from each of icon display regions 211 to 213 is observed when viewed from the front side. When the organic EL module 101 is in the non-light-emitting state, the display of the design in each of the icon display regions 211 to 213 is not observed.

It will be understood that the designs (patterns) in the icon display regions 211 to 213 shown in FIG. 1 are mere non-limiting examples and may be replaced with any other figures, letters, or patterns.

As used herein, the term "icon display region" refers to a region occupied by the design (pattern or figure), letter, image, or any other object to be displayed with the light emitted by the organic EL element. As used herein, the term "icon display region" refers to what is called a software icon (common function key button) and is not intended to include any icon displayed on the liquid crystal display screen.

Figure 2:
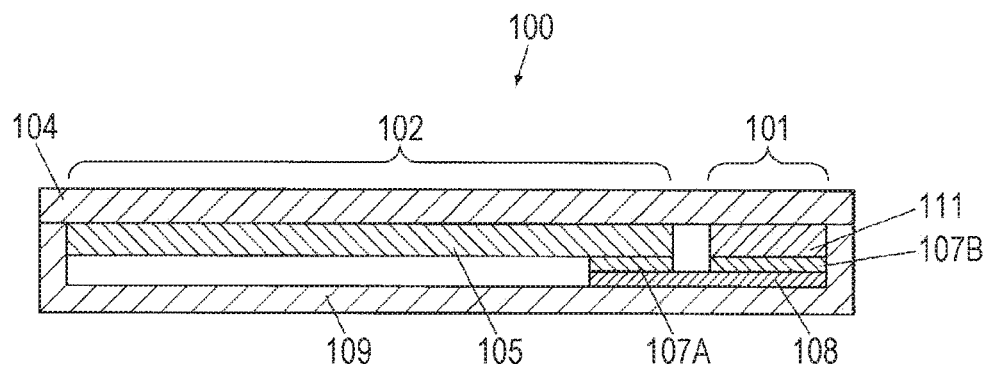
FIG. 2 is a schematic cross-sectional view showing an example of the information device including the organic electroluminescence module of the present invention.

FIG. 2 is an A-A cross-sectional view schematically showing the information device of FIG. 1.

Referring to the A-A cross-sectional view of FIG. 2, the information device 100 of the present invention includes the organic EL module 101, the liquid crystal display screen 102, and a case 109 housing them.

The organic EL module 101 and the liquid crystal display screen 102 are electrically connected through a printed circuit board 108 provided in contact with the bottom surface of the U-shaped case 109 having an opening, in which the bottom surface is parallel to the opening.

The organic EL module 101 includes an electrical connection unit 107B and light-emitting units 111, 112, and 113 electrically connected to the electrical connection unit 107B, in which the electrical connection unit 107A and the light-emitting units 111, 112, and 113 are provided on the printed circuit board 108. The light-emitting units 111, 112, and 113 are each electrically connected to the flexible printed board 107B. Specifically, the light-emitting units 111 and 112 are electrically connected in series through extraction wiring formed on the flexible printed board, and the light-emitting units 112 and 113 are electrically connected in series through extraction wiring formed on the flexible printed board.

The liquid crystal display screen 102 includes an electrical connection unit 107A and a liquid crystal display panel 105, which are provided on the printed circuit board 108.

A cover glass 104 is provided in contact with the liquid crystal display panel 105 and the light-emitting units 111, 112, and 113 to cover the opening of the case 109. The cover glass may be one conventionally known in the art. Any other transparent material such as a plastic material may also be used. To prevent the cover glass from being scratched during use, the cover glass is preferably laminated with a transparent sheet or other materials.

The light-emitting unit 111 includes an organic EL element 300, extraction wirings for connection to the electrical connection unit 107B, and other components. These components will be described in detail.

[Structure of Organic EL Module]

In the present invention, the organic EL module has a plurality of light-emitting units (also referred to as organic EL panels) electrically connected with a conductive material (member).

The connection between the light-emitting units is such that the anode of each light-emitting unit is electrically connected to the cathode of the adjacent light-emitting unit through the extraction wiring of the electrical connection unit 107B.

In the organic EL module, each organic EL element is connected to the electrical connection unit 107B, for example, through an anisotropic conductive film (ACF) (not shown).

Specifically, an electrode is extracted from the organic EL element in each light-emitting unit and electrically connected to the electrical connection unit 107B through the anisotropic conductive film. The electrical connection unit 107B is also connected to a driver IC (not shown) and the printed circuit board.

A polarizing member is preferably provided on the light-emitting surface side of the transparent substrate. A half mirror or a black filter may also be used instead of the polarizing member. In this case, the organic EL module can display a block color, which is not possible with a light guiding panel.

<Light-Emitting Units>

In the present invention, the light-emitting units are each a light-emitting device including an organic electroluminescence element. In the organic EL module, the light-emitting units are electrically connected to one another. In each light-emitting unit, the organic EL element is patterned in a shape corresponding to the design (pattern or figure) to be displayed by light emission.

The method for patterning the organic EL element and the method for the electrical connection will be described later in detail.

<Electrical Connection Unit>

The electrical connection unit is preferably a flexible printed circuit including a flexible substrate, a capacitive detection circuit part on one surface of the substrate, and a wiring part on the back surface of the substrate.

The flexible substrate used to form the electrical connection unit may be any plastic material having transparency, flexibility, and sufficient mechanical strength. Examples of such a material include polyimide resin (PI), polycarbonate resin, polyethylene terephthalate resin (PET), polyethylene naphthalate resin (PEN), and cycloolefin resin (COP), among which polyimide resin (PI), polyethylene terephthalate resin (PET), and polyethylene naphthalate resin (PEN) are preferred.

The detection circuit part and the back side wiring part preferably include a conductive metal material, such as gold, silver, copper, or ITO. In the present invention, they are preferably made of copper.

<Polarizing Member>

In the organic EL module of the present invention, a commercially available polarizing plate or circularly polarizing plate may be used as the polarizing member.

A polarizing film as a main component of the polarizing plate is an element that allows only light with a specific plane of polarization to pass through, which is typically a polyvinyl alcohol-based polarizing film. Examples of such a polyvinyl alcohol-based polarizing film generally include polyvinyl alcohol-based films dyed with iodine and those dyed with a dichroic dye. A polarizing film that may be used is produced by a process that includes forming a film from a polyvinyl alcohol aqueous solution, uniaxially stretching and then dyeing the film or dyeing and then uniaxially stretching the film, and preferably subjecting the film to a durability-improving treatment with a boron compound. In the present invention, a polarizing film with a thickness in the range of 5 to 30 μm, preferably in the range of 8 to 15 μm is preferably used.

A commercially available polarizing plate protective film is also preferably used, examples of which include KC8UX2MW, KC4UX, KC5UX, KC4UY, KC8UY, KC12UR, KC4UEW, KC8UCR-3, KC8UCR-4, KC8UCR-5, KC4FR-1, KC4FR-2, KC8UE, and KC4UE (all manufactured by KONICA MINOLTA, INC.).

An adhesive having not only optical transparency but also a suitable level of viscoelasticity and adhesive properties is preferably used to bond the polarizing member to a supporting substrate.

Examples of such an adhesive include acrylic copolymers, epoxy resins, polyurethane, silicone polymers, polyether, butyral resins, polyamide resins, polyvinyl alcohol resins, and synthetic rubber. In particular, acrylic copolymers are preferably used because their adhesive physical properties are easiest to control and they have a high level of transparency, weather resistance, and durability. These pressure-sensitive adhesives may be applied to the substrate and then subjected to drying, chemical curing, thermal curing, thermal melting, or photo-curing to form a cured film.

[Manufacture of Organic Electroluminescence Module]

The organic electroluminescence module of the present invention preferably includes light-emitting units (also referred to as organic electroluminescence panels) according to the present invention and an electrical connection unit, in which the electrical connection unit is preferably placed on the side opposite to the light-emitting surface of the light-emitting units, and the detection circuit part of the electrical connection unit is preferably connected to the connection electrode parts of the light-emitting units.

The light-emitting unit-side surface of the electrical connection unit is provided with extraction wirings for connection to the light emitting-units, and the extraction wirings are connected to the back side wirings for connection to a driver IC (not shown) placed on the back side of the electrical connection unit.

The electrical connection material is preferably an anisotropic conductive film (ACF), a conductive paste, or a metal paste although it may be any material with electrical conductivity.

<Anisotropic Conductive Film>

The anisotropic conductive film may be, for example, a layer including a thermosetting resin and conductive fine particles mixed therein. The conductive particles-containing layer for use in the present invention may be appropriately selected from any layers containing conductive particles as an anisotropic conductive material, depending on the purpose.

In the present invention, the conductive particles for use as the anisotropic conductive material are typically, but not limited to, metal particles or metal-coated resin particles, which may be appropriately selected depending on the purpose. Commercially available ACFs include low temperature-curable ACFs, such as MF-331 (manufactured by Hitachi Chemical Company, Ltd.), which are also suitable for use on resin films.

Examples of the metal particles include nickel, cobalt, silver, copper, gold, and palladium particles. These metals may be used alone or in combination of two or more. In particular, nickel, silver, and copper are preferred. The surface of the particles to be used may also be coated with gold or palladium for preventing surface oxidation of them. Particles with surface projections of metal or particles with an insulating coating of an organic material may also be used.

The metal-coated resin particles may be, for example, particles each including a resin core and a coating formed on the surface of the core and including a metal selected from nickel, copper, gold, and palladium. Particles each including a resin core and a gold or palladium coating on the outermost surface of the core may also be used. Particles each including a resin core and metal projections or an organic insulating coating on the surface of the core may also be used.

In the present invention, a conductive paste or any other fluid material, such as a silver paste, may also be used instead of the anisotropic conductive film.

The metal paste may be appropriately selected and used from commercially available metal nanoparticle pastes such as silver particle pastes, silver-palladium particle pastes, gold particle pastes, and copper particle pastes. Examples of metal pastes include silver pastes for organic EL element substrates (such as CA-6178, CA-6178B, CA-2500E, CA-2503-4, CA-2503N, and CA-271, specific resistance 15 to 30 mΩ·cm, formed by screen printing, curing temperature 120 to 200° C.), pastes for LTCC (PA-88 (Ag), TCR-880 (Ag), and PA-Pt (Ag.Pt)), and silver pastes for glass substrates (US-201 and UA-302, baking temperature 430 to 480° C.), which are commercially available from DAIKEN CHEMICAL CO., LTD.

[Structure of Organic Electroluminescence Element]

Next, the structure of the organic EL element 300 will be described in detail.

Figure 3:
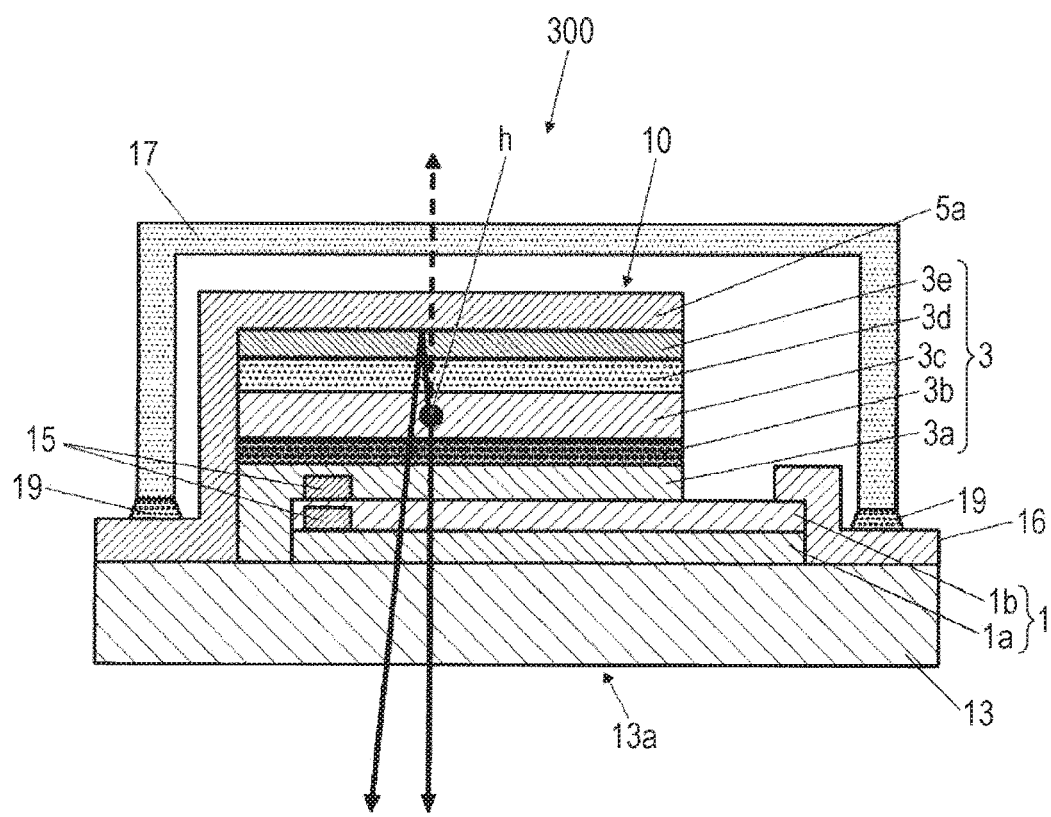
FIG. 3 is a schematic diagram showing an example of an organic electroluminescence element.

The organic EL element 300 is used in each of the light-emitting units 111, 112, and 113 of the organic electroluminescence module 101 of the present invention. For example, as shown in FIG. 3, the organic EL element 300 includes a transparent substrate 13 and a laminate 10 of a first electrode (anode) 1, an organic layer 3, and a second electrode (cathode) 5a formed on the substrate 13, in which the organic layer 3 includes, for example, a hole injection layer 3a, a hole transport layer 3b, a light-emitting layer 3c, an electron transport layer 3d, and an electron injection layer 3e.

An end of the anode 1 is provided with an extraction wiring, which is electrically connected to the electrical connection unit 107B.

Typical examples of the structure of the organic EL element are shown below.

(i) A stack of an anode, a hole injection/transport layer, a light-emitting layer, an electron injection/transport layer, and a cathode (ii) A stack of an anode, a hole injection/transport layer, a light-emitting layer, a hole-blocking layer, an electron injection/transport layer, a cathode (iii) A stack of an anode, a hole injection/transport layer, an electron-blocking layer, a light-emitting layer, a hole-blocking layer, an electron injection/transport layer, and a cathode (iv) A stack of an anode, a hole injection layer, a hole transport layer, a light-emitting layer, an electron transport layer, an electron injection layer, and a cathode (v) A stack of an anode, a hole injection layer, a hole transport layer, a light-emitting layer, a hole-blocking layer, an electron transport layer, an electron injection layer, and a cathode (vi) A stack of an anode, a hole injection layer, a hole transport layer, an electron-blocking layer, a light-emitting layer, a hole-blocking layer, an electron transport layer, an electron injection layer, and a cathode The organic EL element may further include a non-luminescent intermediate layer between light-emitting layers. The intermediate layer may be a charge-generating layer and may form a multiphoton unit structure. To reduce resistance, auxiliary electrodes 15 may also be provided in contact with the first electrode 1. The organic EL element 300 is sealed on the resin substrate 13 with a sealing member 17, which will be described later, for the purpose of preventing the degradation of the organic layer 3 including an organic material and other components. The sealing member (hereinafter also referred to as the sealant) 17 is fixed on the resin substrate 13 side with an adhesive 19 in between. As an exception, the terminal parts for the first electrode 1, the extraction electrode 16, and the second electrode 5a are exposed on the resin substrate 13 from the sealing member 17 while being insulated from one another by the organic layer 3. The organic EL element 300 is so configured that generated light (emitted light h) is extracted from at least the light extraction surface 13a of the resin substrate 13.

Examples of the general structure of the organic EL element suitable for use in the present invention include those described in JP 2013-157634 A, JP 2013-168552 A, JP 2013-177361 A, JP 2013-187211 A, JP 2013-191644 A, JP 2013-191804 A, JP 2013-225678 A, JP 2013-235994 A, JP 2013-243234 A, JP 2013-243236 A, JP 2013-242366 A, JP 2013-243371 A, JP 2013-245179 A, JP 2014-003249 A, JP 2014-003299 A, JP 2014-013910 A, JP 2014-017493 A, and JP 2014-017494 A.

Each layer constituting the organic EL element will be further described.

[Transparent Substrate]

The transparent substrate suitable for use in the organic EL element according to the present invention may be, for example, a transparent material such as glass or plastic. Preferably, glass, quartz, or a resin film is used to form the transparent substrate.

The glass may be, for example, silica glass, soda lime silica glass, lead glass, borosilicate glass, alkali-free glass, or the like. In view of adhesion to the adjacent layer, durability, and smoothness, if necessary, the surface of these glass materials may be subjected to a physical process such as polishing, or a coating of an inorganic or organic material or a hybrid coating of a combination thereof may be formed on the surface of these glass materials.

The resin film may be made of, for example, polyester such as polyethylene terephthalate (PET) or polyethylene naphthalate (PEN), polyethylene, polypropylene, cellophane, cellulose esters such as cellulose diacetate, cellulose triacetate (TAC), cellulose acetate butyrate, cellulose acetate propionate (CAP), cellulose acetate phthalate, and cellulose nitrate, or derivatives thereof, polyvinylidene chloride, polyvinyl alcohol, polyethylene vinyl alcohol, syndiotactic polystyrene, polycarbonate, norbornene resin, polymethylpentene, polyether ketone, polyimide, polyether sulfone (PES), polyphenylene sulfide, polysulfones, polyether imide, polyether ketone imide, polyamide, fluororesin, nylon, polymethyl methacrylate, acrylic or polyarylates, or cycloolefin resin such as ARTON (trade name, manufactured by JSR Corporation) or APEL (trade name, manufactured by Mitsui Chemicals, Inc.).

In the organic EL element, if necessary, a gas barrier layer may be provided on the transparent substrate described above.

The gas barrier layer may be made of any material having the function of inhibiting the infiltration of water, oxygen, and other substances capable of inducing the degradation of the organic EL element. For example, an inorganic material such as silicon oxide, silicon dioxide, or silicon nitride may be used to form the gas barrier film. The gas barrier layer more preferably has a multilayer structure of such an inorganic layer and a layer of an organic material (organic layer) so that the brittleness of the gas barrier film can be reduced.

The inorganic and organic layers may be stacked in any order. Preferably, both are alternately stacked a plurality of times.

(Anode)

The anode constituting the organic EL element may be made of, for example, a metal such as Ag or Au, an alloy including a metal as a main component, CuI, an indium-tin complex oxide (ITO), or a metal oxide such as indium zinc oxide (IZO), $SnO_2$, or ZnO. The anode is preferably made of a metal or an alloy including a metal as a main component, more preferably made of silver or an alloy including silver as a main component.

Silver may be used as a main component to form the anode as a transparent electrode. In this case, the purity of silver should preferably be 99% or more. To ensure the stability of silver, palladium (Pd), copper (Cu), and gold (Au) may also be added to the silver.

The transparent electrode may be a layer including silver as a main component. Specifically, the transparent electrode may be made of silver alone or a silver (Ag)-containing alloy. Such an alloy may be, for example, a silver-magnesium (Ag—Mg) alloy, a silver-copper (Ag—Cu) alloy, a silver-palladium (Ag—Pd) alloy, a silver-palladium-copper (Ag—Pd—Cu) alloy, or a silver-indium (Ag—In) alloy.

Any of these materials may be used to form the anode. In particular, the anode constituting the organic EL element according to the present invention is preferably a transparent anode including silver as a main component and having a thickness in the range of 2 to 20 nm, more preferably in the range of 4 to 12 nm. When the thickness is 20 nm or less, absorption or reflection by the transparent anode can be kept low, so that a high light transmittance can be maintained, which is preferred.

In the present invention, the term "a layer including silver as a main component" refers to a transparent anode with a silver content of 60% by weight or more, preferably with a silver content of 80% by weight or more, more preferably with a silver content of 90% by weight or more, even more preferably with a silver content of 98% by weight or more. Regarding the transparent anode in the present invention, the term "transparent" means that its light transmittance is 50% or more at a wavelength of 550 nm.

If necessary, the transparent anode may also include a stack of a plurality of layers each including silver as a main component.

In the present invention, when the anode is a transparent anode including silver as a main component, an underlying layer 1a is preferably provided under the transparent anode in order to improve the uniformity of the silver film formed as the transparent anode. The underlying layer is preferably, but not limited to, a layer containing a nitrogen or sulfur atom-containing organic compound. In a preferred mode, the method of forming the transparent anode includes forming an electrode layer 1b on the underlying layer.

(Organic Layer)

Various functional layers used to form the organic EL element will be described in the following order: light-emitting layer, charge injection layer, hole transport layer, electron transport layer, and blocking layer.

(Light-Emitting Layer)

The light-emitting layer constituting the organic EL element preferably includes a phosphorescent compound as a luminescent material.

The light-emitting layer is a layer capable of emitting light by recombination of electrons and holes injected from the electrode or the electron transport layer and the hole transport layer, respectively. The light-emitting part may be inside the light-emitting layer or at the interface between the light-emitting layer and the adjacent layer.

The light-emitting layer with such features may have any structure as long as the luminescent material therein satisfies the conditions necessary for the light emission. A plurality of light-emitting layers may also be provided having the same emission spectrum or emission maximum wavelength. In this case, a non-luminescent intermediate layer is preferably provided between each pair of light-emitting layers.

The total thickness of the light-emitting layer or layers is preferably in the range of 1 to 100 nm, more preferably in the range of 1 to 30 nm so that a lower drive voltage can be achieved. In this regard, when a non-luminescent intermediate layer is provided between the light-emitting layers, the thickness of the intermediate layer is included as part of the total thickness of the light-emitting layers.

The light-emitting layer described above can be formed by subjecting a luminescent material or a host compound (described below) to any of known methods such as vacuum vapor deposition, spin coating, casting, LB method (Langmuir Blodgett method), and inkjet method.

The light-emitting layer may also include a mixture of a plurality of luminescent materials. A mixture of a phosphorescent material and a fluorescent material (also referred to as a fluorescent dopant or a fluorescent compound) may also be used in a single light-emitting layer. The light-emitting layer preferably includes a host compound (also referred to as a light-emitting host or the like) and a luminescent material (also referred to as a light-emitting dopant compound), in which light is preferably emitted from the luminescent material.

<Host Compound>

The host compound to be used in the light-emitting layer is preferably a compound whose phosphorescence quantum yield is less than 0.1 with respect to phosphorescence emission at room temperature (25° C.). The phosphorescence quantum yield is more preferably less than 0.01. The host compound preferably makes up 50% or more of the volume of the compounds in the light-emitting layer.

A known host compound may be used alone, or two or more known host compounds may be used together. Using two or more host compounds, charge transfer can be controlled so that the organic electroluminescence element can have a high efficiency. Two or more of the luminescent materials described below may also be used so that different emissions can be mixed, which makes it possible to obtain any desired emission color.

The host compound used in the light-emitting layer may be a conventionally known low molecular weight compound, a conventionally known polymer compound having a repeating unit(s), or a conventionally known low molecular weight compound having a polymerizable group such as a vinyl group or an epoxy group (vapor deposition-polymerizable light-emitting host).

Examples of the host compound suitable for use in the present invention include the compounds described in JP 2001-257076 A, JP 2001-357977A, JP 2002-8860A, JP 2002-43056 A, JP 2002-105445 A, JP 2002-352957 A, JP 2002-231453 A, JP 2002-234888 A, JP 2002-260861 A, JP 2002-305083 A, US 2005/0,112,407 A, US 2009/0,030,202 A, WO 2001/039234 A, WO 2008/056746 A, WO 2005/089025 A, WO 2007/063754 A, WO 2005/030900 A, WO 2009/086028 A, WO 2012/023947 A, JP 2007-254297 A, and EP 2034538 A.

<Luminescent Material>

Examples of the luminescent material for use in the present invention include a phosphorescence-emitting compound (also referred to as a phosphorescent compound, a phosphorescence-emitting material, or a phosphorescence-emitting dopant) and a fluorescence-emitting compound (also referred to as a fluorescent compound or a fluorescence-emitting material).

<Phosphorescence-Emitting Compound>

The phosphorescence-emitting compound is such a compound that emission from the excited triplet can be observed. Specifically, the phosphorescence-emitting compound may be defined as a compound that emits phosphorescence at room temperature (25° C.) and has a phosphorescence quantum yield of 0.01 or more at 25° C. The phosphorescence quantum yield is preferably 0.1 or more.

The phosphorescence quantum yield can be measured by the method described on page 398 of The 4th Edition Handbook of Experimental Chemistry 7, Spectroscopy II (1992, Maruzen). The phosphorescence quantum yield in a solution can be measured using various solvents. The phosphorescence quantum yield of the phosphorescence-emitting compound for use in the present invention should be 0.01 or more in any one of such solvents.

The phosphorescence-emitting compound may be appropriately selected and used from known compounds used in light-emitting layers of common organic EL elements. Preferably, the phosphorescence-emitting compound is a complex compound containing a metal belonging to Groups 8 to 10 of the periodic table. The phosphorescence-emitting compound is more preferably an iridium compound, an osmium compound, a platinum compound (platinum complex compound), or a rare earth metal complex, most preferably an iridium compound.

In the present invention, at least one light-emitting layer may contain two or more phosphorescence-emitting compounds, and the concentration of the phosphorescence-emitting compound in the light-emitting layer may vary in the thickness direction of the light-emitting layer.

Examples of known phosphorescence-emitting compounds that may be used in the present invention include the compounds described in the following literatures:

Nature, 395, 151 (1998), Appl. Phys. Lett., 78, 1622 (2001), Adv. Mater. 19, 739 (2007), Chem. Mater., 17, 3532 (2005), Adv. Mater., 17, 1059 (2005), WO 2009/100991 A, WO 2008/101842 A, WO 2003/040257 A, US 2006/835,469 A, US 2006/0,202,194 A, US 2007/0,087,321 A, and US 2005/0,244,673 A.

Examples also include the compounds described in Inorg. Chem., 40, 1704 (2001), Chem. Mater., 16, 2480 (2004), Adv. Mater., 16, 2003 (2004), Angew. Chem. Int. Ed., 2006, 45, 7800, Appl. Phys. Lett., 86, 153505 (2005), Chem. Lett., 34, 592 (2005), Chem. Commun., 2906 (2005), Inorg. Chem., 42, 1248 (2003), WO 2009/050290 A, WO 2009/000673 A, U.S. Pat. No. 7,332,232, US 2009/0,039,776 A, U.S. Pat. No. 6,687,266, US 2006/0,008,670 A, US 2008/0,015,355 A, U.S. Pat. No. 7,396,598, US 2003/0,138,657 A, and U.S. Pat. No. 7,090,928.

Examples also include the compounds described in Angew. Chem. Int., Ed. 47, 1 (2008), Chem. Mater., 18, 5119 (2006), Inorg. Chem., 46, 4308 (2007), Organometallics, 23, 3745 (2004), Appl. Phys. Lett., 74, 1361 (1999), WO 2006/056418 A, WO 2005/123873 A, WO 2005/123873 A, WO 2006/082742 A, US 2005/0,260,441 A, U.S. Pat. No. 7,534,505, US 2007/0,190,359 A, U.S. Pat. No. 7,338,722, U.S. Pat. No. 7,279,704, and US 2006/103,874 A.

Examples also include the compounds described in WO 2005/076380 A, WO 2008/140115 A, WO 2011/134013 A, WO 2010/086089 A, WO 2012/020327 A, WO 2011/051404 A, WO 2011/073149 A, JP 2009-114086 A, JP 2003-81988 A, and JP 2002-363552 A.

In the present invention, the phosphorescence-emitting compound is preferably an organometallic complex having Ir as a central metal. The phosphorescence-emitting compound is more preferably a complex having at least one coordination moiety from a metal-carbon bond, a metal-nitrogen bond, a metal-oxygen bond, and a metal-sulfur bond.

Examples of phosphorescence-emitting compounds (also referred to as phosphorescence-emitting metal complexes) include those described in Organic Letter, Vol. 3, No. 16, pp. 2579-2581 (2001), Inorg. Chem., Vol. 30, No. 8, pp. 1685-1687 (1991), J. Am. Chem. Soc., Vol. 123, p. 4304 (2001), Inorg. Chem., Vol. 40, No. 7, pp. 1704-1711 (2001), Inorg. Chem., Vol. 41, No. 12, pp. 3055-3066 (2002), New Journal of Chemistry, Vol. 26, p. 1171 (2002), and European Journal of Organic Chemistry, Vol. 4, pp. 695-709 (2004), and the methods described in these literatures may be used to synthesize phosphorescence-emitting compounds.

<Fluorescence-Emitting Compound>

Examples of the fluorescence-emitting compound include coumarin dyes, pyran dyes, cyanine dyes, croconium dyes, squarylium dyes, oxobenzanthracene dyes, fluorescein dyes, rhodamine dyes, pyrylium dyes, perylene dyes, stilbene dyes, polythiophene dyes, and rare earth complex fluorescent materials.

(Charge Injection Layer)

The charge injection layer is a layer provided between the electrode and the light-emitting layer so as to reduce the drive voltage or improve the emission luminance. Such a layer is described in detail in "Organic EL Devices and Forefront of Their Industrialization", published by NTS Inc., Nov. 30, 1998, Part 2, Chapter 2, "Electrode Materials", pages 123-166. Examples include a hole injection layer and an electron injection layer.

A charge injection layer as a hole injection layer is generally provided between an anode and a light-emitting layer or a hole transport layer, and a charge injection layer as an electron injection layer is generally provided between a cathode and a light-emitting layer or an electron transport layer. In the present invention, the charge injection layer is characterized by being placed adjacent to the transparent electrode. When the charge injection layer is used for an intermediate electrode, at least one of an electron injection layer and a hole injection layer adjacent to the intermediate electrode should satisfy the requirements of the present invention.

(Hole Injection Layer)

The hole injection layer is a layer placed adjacent to the anode as a transparent electrode so as to reduce the drive voltage or improve the emission luminance. Such a layer is described in detail in "Organic EL Devices and Forefront of Their Industrialization", published by NTS Inc., Nov. 30, 1998, Part 2, Chapter 2, "Electrode Materials", pages 123-166.

The hole injection layer is also described in detail in publications such as JP 09-45479 A, JP 09-260062 A, and JP 08-288069 A. Examples of materials for use in the hole injection layer include porphyrin derivatives, phthalocyanine derivatives, oxazole derivatives, oxadiazole derivatives, triazole derivatives, imidazole derivatives, pyrazoline derivatives, pyrazolone derivatives, phenylenediamine derivatives, hydrazone derivatives, stilbene derivatives, polyarylalkane derivatives, triarylamine derivatives, carbazole derivatives, indolocarbazole derivatives, isoindole derivatives, acene derivatives such as anthracene and naphthalene derivatives, fluorene derivatives, fluorenone derivatives, polyvinyl carbazole, polymers or oligomers having aromatic amine incorporated in the main or side chain, polysilane, and conductive polymers or oligomers (such as PEDOT (polyethylenedioxythiophene):PSS (polystyrenesulfonic acid), aniline copolymers, polyaniline, and polythiophene).

Triarylamine derivatives include benzidines such as α-NPD (4, 4'-bis[N-(1-naphthyl)-N-phenylamino]biphenyl), starburst derivatives such as MTDATA (4, 4',4"-tris[N-(3-methylphenyl)-N-phenylamino]triphenylamine), and compounds having a fluorene or anthracene moiety combined with the triarylamine core.

Hexaazatriphenylene derivatives such as those described in JP 2003-519432 W and JP 2006-135145 A may also be used as hole transport materials.

(Electron Injection Layer)

The electron injection layer is a layer provided between the cathode and the light-emitting layer so as to reduce the drive voltage or improve the emission luminance. When the cathode includes a transparent electrode according to the present invention, the electron injection layer is provided adjacent to the transparent electrode. The electron injection layer is described in detail in "Organic EL Devices and Forefront of Their Industrialization", published by NTS Inc., Nov. 30, 1998, Part 2, Chapter 2, "Electrode Materials", pages 123-166.

The electron injection layer is also described in detail in publications such as JP 06-325871 A, JP 09-17574 A, and JP 10-74586 A. Examples of materials preferably used to form the electron injection layer include metals such as strontium and aluminum, alkali metal compounds such as lithium fluoride, sodium fluoride, and potassium fluoride, alkali metal halide layers such as magnesium fluoride and calcium fluoride, alkaline earth metal compound layers such as magnesium fluoride, metal oxides such as molybdenum oxide and aluminum oxide, and metal complexes such as lithium 8-hydroxyquinolate (Liq). In the present invention, when the transparent electrode is the cathode, it is particularly preferable to use organic materials such as metal complexes. The electron injection layer is preferably a very thin film, which preferably has a thickness in the range of 1 nm to 10 μm although it depends on the constituent material.

(Hole Transport Layer)

The hole transport layer includes a hole transport material having the function of transporting holes. In a broad sense, a hole injection layer and an electron-blocking layer also have the function of the hole transport layer. The hole transport layer may be a single layer or a multilayer structure.

The hole transport material has one of the ability to inject or transport holes and the ability to block electrons. The hole transport material may be any of organic and inorganic materials. Examples include triazole derivatives, oxadiazole derivatives, imidazole derivatives, polyarylalkane derivatives, pyrazoline derivatives, pyrazolone derivatives, phenylenediamine derivatives, arylamine derivatives, amino-substituted chalcone derivatives, oxazole derivatives, styrylanthracene derivatives, fluorenone derivatives, hydrazone derivatives, stilbene derivatives, silazane derivatives, aniline-based copolymers, and conductive high-molecular oligomers, specifically, thiophene oligomers.

The hole transport material may be any of the above materials. Preferably, the hole transport material is any of a porphyrin compound, an aromatic tertiary amine compound, and a styrylamine compound. In particular, an aromatic tertiary amine compound is preferably used.

Typical examples of the aromatic tertiary amine compound and the styrylamine compound include N,N,N',N'-tetraphenyl-4,4'-diaminophenyl, N,N'-diphenyl-N,N'-bis(3-methylphenyl)-[1,1'-biphenyl]-4,4'-diamine (abbreviated as TPD), 2,2-bis(4-di-p-tolylaminophenyl)propane, 1,1-bis(4-di-p-tolylaminophenyl)cyclohexane, N,N,N',N'-tetra-p-tolyl-4,4'-diaminobiphenyl, 1,1-bis(4-di-p-tolylaminophenyl)-4-phenylcyclohexane, bis(4-dimethylamino-2-methylphenyl)phenylmethane, bis(4-di-p-tolylaminophenyl)phenylmethane, N,N'-diphenyl-N,N'-di(4-methoxyphenyl)-4,4'-diaminobiphenyl, N,N,N',N'-tetraphenyl-4,4'-diaminodiphenyl ether, 4,4'-bis(diphenylamino)quadriphenyl, N,N,N-tri(p-tolyl)amine, 4-(di-p-tolylamino)-4'-[4-(di-p-tolylamino)styryl]stilbene, 4-N,N-diphenylamino-(2-diphenylvinyl)benzene, 3-methoxy-4'-N,N-diphenylaminostilbenzene, and N-phenylcarbazole.

The hole transport layer can be formed by subjecting any of the above hole transport materials to a known thin film forming method such as vacuum vapor deposition, spin coating, casting, printing methods including inkjet method, or LB method (Langmuir Blodgett method). The thickness of the hole transport layer is generally, but not limited to, about 5 nm to about 5 µm, preferably 5 to 200 nm. The hole transport layer may be a single layer structure including one or more of the above materials.

The material for the hole transport layer may also be doped with an impurity for increasing the p-type conductivity. Examples of such an impurity include those described in JP 04-297076 A, JP 2000-196140 A, JP 2001-102175 A, and J. Appl. Phys., 95, 5773 (2004).

The increase in the p-type conductivity of the hole transport layer makes it possible to form an element with lower power consumption, and thus is preferred.

(Electron Transport Layer)

The electron transport layer includes a material having the function of transporting electrons. In a broad sense, an electron injection layer and a hole-blocking layer fall within the category of the electron transport layer. The electron transport layer may be formed as a single layer structure or a multilayer structure.

In the electron transport layer of a single layer structure or a multilayer structure, the electron transport material (also serving as a hole-blocking material) constituting the layer part adjacent to the light-emitting layer only needs to have the function of transmitting electrons to the light-emitting layer when the electrons are injected from the cathode. The material with such properties may be any material selected from conventionally known compounds.

Examples of such compounds include nitro-substituted fluoren derivatives, diphenylquinone derivatives, thiopyran dioxide derivatives, carbodiimide, fluorenylidenemethane derivatives, anthraquinodimethane, anthrone derivatives, and oxadiazole derivatives. Materials that may be used for the electron transport layer also include thiadiazole derivatives derived from the oxadiazole derivatives by replacing the oxygen atom in the oxadiazole ring with a sulfur atom; and quinoxaline derivatives having a quinoxaline ring known as an electron-withdrawing group. Polymer materials having any of these materials incorporated in the polymer chain or polymer materials whose main chain is formed using any of these materials may also be used.

Materials that may be used for the electron transport layer also include 8-quinolinol derivative metal complexes such as tris(8-quinolinol)aluminum (abbreviated as Alq3), tris(5,7-dichloro-8-quinolinol)aluminum, tris(5,7-dibromo-8-quinolinol)aluminum, tris(2-methyl-8-quinolinol)aluminum, tris(5-methyl-8-quinolinol)aluminum, and bis(8-quinolinol)zinc (abbreviated as Znq), and metal complexes derived from any of these metal complexes by replacing the central metal with In, Mg, Cu, Ca, Sn, Ga, or Pb.

The electron transport layer can be formed by subjecting any of the above materials to a known thin film forming method such as vacuum vapor deposition, spin coating, casting, printing methods including inkjet method, or LB method. The thickness of the electron transport layer is generally, but not limited to, about 5 nm to about 5 µm, preferably 5 to 200 nm. The electron transport layer may be a single layer structure including one or more of the above materials.

(Blocking Layer)

Examples of the blocking layer include a hole-blocking layer and an electron-blocking layer. The organic layer 3 may further include the blocking layer, as needed, in addition to each constituting layer described above. For example, JP 11-204258 A, JP 11-204359 A, and "Organic EL Devices and Forefront of Their Industrialization", published by NTS Inc., Nov. 30, 1998, page 237 describe hole-blocking (hole-block) layers.

In a broad sense, the hole-blocking layer has the function of an electron transport layer. The hole-blocking layer includes a hole-blocking material having the function of transporting electrons and a very low ability to transport holes so that it can increase the probability of recombination of electrons and holes by transporting electrons and blocking holes. If necessary, the composition of the electron transport layer may be used to form the hole-blocking layer. The hole-blocking layer is preferably provided adjacent to the light-emitting layer.

In a broad sense, the electron-blocking layer has the function of a hole transport layer. The electron-blocking layer includes a material having the function of transporting holes and a very low ability to transport electrons so that it can increase the probability of recombination of electrons and holes by transporting holes and blocking electrons. If necessary, the composition of the hole transport layer may be used to form the electron-blocking layer. In the present invention, the hole-blocking layer preferably has a thickness in the range of 3 to 100 nm, more preferably in the range of 5 to 30 nm.

(Cathode)

The cathode is an electrode film for functioning to supply holes to the organic layer. Any of metals, alloys, organic or inorganic conductive compounds, and mixtures thereof may be used to form the cathode. Specifically, such materials include gold, aluminum, silver, magnesium, lithium, a magnesium-copper mixture, a magnesium-silver mixture, a magnesium-aluminum mixture, a magnesium-indium mixture, indium, a lithium-aluminum mixture, rare earth metals, and oxide semiconductors such as ITO, ZnO, $TiO_2$, and $SnO_2$.

The cathode can be produced by forming a thin film of any of these conductive materials by vapor deposition, sputtering, or other methods. The sheet resistance of the cathode as a second electrode is preferably not more than several hundred Ω/square, and its thickness is generally selected in the range of 5 nm to 5 µm, preferably in the range of 5 to 200 nm.

The organic EL element may be of a double-sided emission type in which the emitted light h is also extracted from the cathode side. In this case, a material with high optical transparency should be selected and used to form the cathode.

[Sealing Member]

Means for sealing the organic EL element may be, for example, a method of bonding a sealing member to the cathode and the transparent substrate with an adhesive.

The sealing member may be placed to cover the display region of the organic EL element. The sealing member may be concave sheet-shaped or flat sheet-shaped. The sealing member may also have any level of transparency and electrical insulating properties.

Specifically, the sealing member may be a glass sheet, a polymer sheet or film, or a metal sheet or film. Specifically, the glass sheet may include soda-lime glass, barium/strontium-containing glass, lead glass, aluminosilicate glass, borosilicate glass, barium borosilicate glass, or quartz. The polymer sheet may include polycarbonate, acrylic, polyethylene terephthalate, polyether sulfide, or polysulfone. The metal sheet may include at least one metal selected from the group consisting of stainless steel, iron, copper, aluminum, magnesium, nickel, zinc, chromium, titanium, molybdenum, silicon, germanium, and tantalum, and alloys thereof.

A polymer film or a metal film is preferably used as the sealing member, so that the organic EL element can be made thin. In addition, the polymer film preferably has a water-vapor permeability of $1\times10^{-3}$ $g/m^2 \cdot 24$ h or less at a temperature of $25\pm0.5°$ C. and a relative humidity of $90\pm2\%$ as measured by the method according to JIS K 7129:1992 and more preferably has an oxygen permeability of $1\times10^{-3}$ $ml/m^2 \cdot h \cdot atm$ (1 atm is $1.01325\times10^5$ Pa) or less as measured by the method according to JIS K 7126:1987 and a water-vapor permeability of $1\times10^{-3}$ $g/m^2 \cdot 24$ h or less at a temperature of $25\pm0.5°$ C. and a relative humidity of $90\pm2\%$.

An inert gas such as nitrogen or argon (gas phase) or an inert liquid such as fluorinated hydrocarbon or silicone oil (liquid phase) is preferably injected into the gap between the sealing member and the display region (light-emitting region) of the organic EL element. The gap between the sealing member and the display region of the organic EL element may also be evacuated to vacuum, or a moisture absorbing compound may also be sealed in the gap.

[Method for Manufacturing Organic EL Element]

A method for manufacturing the organic EL element includes forming an anode, organic layers, and a cathode on a transparent substrate to form a laminate 10.

First, a transparent substrate is provided, on which a thin film of a desired electrode material such as an anode material is deposited with a thickness of 1 μm or less, preferably a thickness in the range of 10 to 200 nm by vapor deposition, sputtering, or other methods to form an anode. At the same time, a part for connection to an external power source is formed at an end of the anode.

Subsequently, organic layers including a hole injection layer, a hole transport layer, a light-emitting layer, and an electron transport layer are sequentially stacked on the anode.

Each of these layers may be formed by, for example, spin coating, casting, inkjet method, vapor deposition, or printing. Vacuum vapor deposition or spin coating is particularly preferred because of its advantages such as ease of uniform layer formation and low probability of pin-hole formation. In addition, the method used to form the layer may differ from layer to layer. When vapor deposition is used to form each layer, the deposition conditions, although varying with the type of the compound used and other factors, are preferably selected as appropriate from the following common ranges: boat heating temperature 50 to 450° C., the degree of vacuum $1\times10^{-6}$ to $1\times10^{-2}$ Pa, deposition rate 0.01 to 50 nm/sec, substrate temperature −50 to 300° C., layer thickness 0.1 to 5 μm.

After the organic layer is formed as described above, a cathode is formed on the top of the organic layer by any appropriate method such as vapor deposition or sputtering. In this process, the cathode is formed and patterned to have a terminal part extending from the top of the organic layer to the edge of the transparent substrate, while it is insulated from the anode by the organic layer.

After the cathode is formed, the transparent substrate, the anode, the organic layer, and the cathode are sealed with a sealing member. Specifically, a sealing member is provided on the transparent substrate to cover at least the organic layer while the terminal parts of the anode and cathode are exposed.

[Method for Patterning Organic EL Element]

In the present invention, a plurality of icon display regions are preferably formed by batch patterning with light applied from the transparent substrate side or the sealing member side. The patterning method may be, for example, photolithography or etching. In particular, patterning by UV irradiation is preferred. In the patterning process, an electrode and at least one organic layer needs to be subjected to UV irradiation. In addition, any other layer may also be converted to a non-light-emitting region by UV irradiation for changing its function.

Specifically, the process of forming the organic EL element includes depositing each component of the organic EL element as described above, then performing sealing with a sealing member as describe above, and applying light from the transparent substrate 13 side or the sealing member side so that a shape corresponding to the icon to be displayed on each of a plurality of units is formed by patterning using photoirradiation. The patterning method may be, for example, that described in JP 2001-167881 A.

Figure 5A:
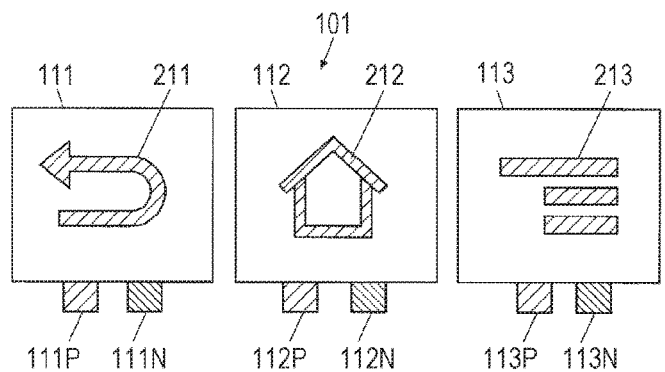
FIG. 5A is a schematic diagram of extraction electrodes of light-emitting units corresponding to icon display regions.

In order to obtain emitted light patterns, for example, as shown in FIG. 5A, the photoirradiation process includes providing a mask sheet having nontransparent parts formed to protect light-emitting regions 211, 212, and 213 from light. Subsequently, a first step is performed, in which the mask sheet is placed on the sealing member side, aligned with the position of the light-emitting regions, and fixed.

After the alignment is completed, UV irradiation is performed to change the luminance of part of each of light-emitting units 111, 112, and 113, exclusive of the icon display regions (light-emitting regions) 211, 212, and 213 of the units. The parts with their luminance changed, which no longer function as light-emitting regions, may be maintained as they are on the substrate, so that any removal step can be omitted.

Specifically, parts of the cathode in the area where the light-emitting units are not covered with the mask sheet are subjected at a time to UV irradiation. Preferred wavelengths of the ultraviolet light applied are 355, 365, 380, and 405 nm. In general, light with a shorter wavelength has higher energy, which is preferable in that the applied light is more likely to reach all the films. However, if the wavelength selected is shorter than the above wavelength, the transparent substrate may absorb the light to undergo degradation. Therefore, it is most suitable to use the above wavelengths. In this process, a non-light-emitting region can be formed in a multilayer structure, such as that of the organic EL element 300, by subjecting an electrode and at least one organic layer to UV irradiation at the above wavelength. Any other layer of the multilayer structure may also be subjected to the UV irradiation, which is more effective for forming the non-light-emitting region.

Alternatively, the method of patterning a plurality of light-emitting units may include placing a mask sheet at a stage where the organic layer has been formed, and then performing UV irradiation.

«Design of Icon Display Regions»

The embodiments described below show non-limiting examples where the organic electroluminescence module has three light-emitting units 111 to 113. The light-emitting units 111 to 113 are characterized by being electrically connected in series.

The method for designing the icon display regions 211 to 213 in each embodiment will be described in detail.

Embodiment 1

«Case where Icon Display Regions Emit Different Colors of Light»

When the colors of light emitted by the icon display regions differ from region to region, the icon display regions preferably have the same emission luminance.

Figure 4A:
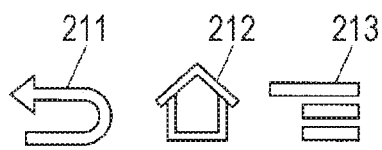
FIG. 4A is a schematic diagram showing exemplary icon display regions.

For example, as shown in FIG. 4A, the information device may have an arrow button 211, a home button 212, and a menu button 213 as software buttons, on which the symbols are displayed in different colors, red, blue, and green. This case will be described below.

When the colors of light emitted by the icon display regions differ from region to region, different luminescent compounds are used in the different icon display regions of the organic EL elements, and thus the light-emitting regions have different resistances. Therefore, in order for the light-emitting regions to have the same luminance, the organic EL elements to be used are measured for resistance in advance, and the materials used for the organic EL elements and the area where the organic EL elements are arranged are so selected and adjusted that the light-emitting units will have the same current density, when the light-emitting units are formed.

Figure 5B:
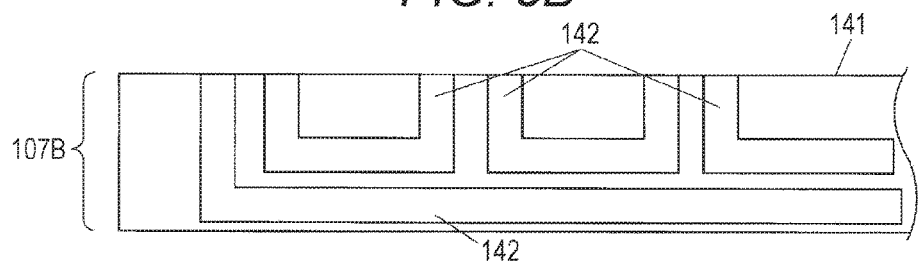
FIG. 5B is a schematic diagram of a flexible board having printed extraction wiring.
Figure 5C:
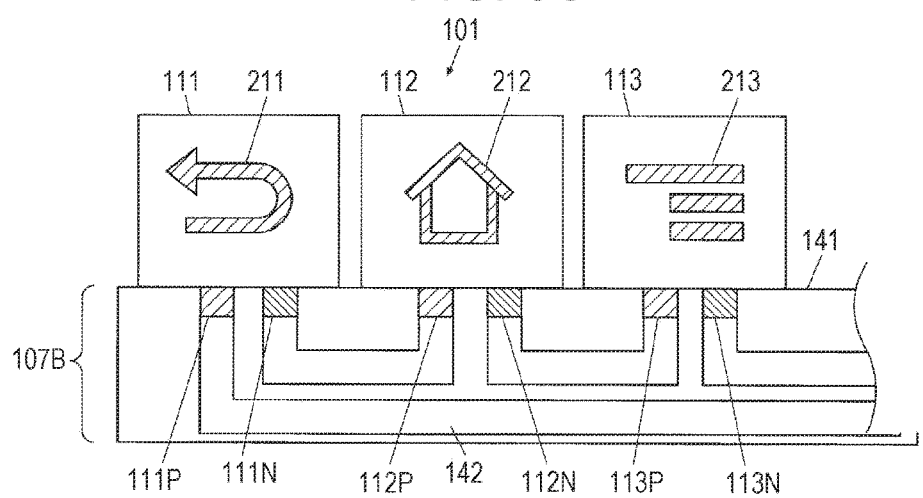
FIG. 5C is a schematic diagram showing an example of the part of connection between a circuit board and light-emitting units that form icon display regions.

Subsequently, the anode and cathode of each light-emitting unit are connected to the extraction wiring 142 of the flexible board 141 shown in FIG. 5B. Specifically, as shown in FIG. 5C, the anode-side extraction electrode 111P of the light-emitting unit 111 is so connected that it can be connected to a power source (not shown). The cathode-side extraction electrode 111N is electrically connected to the extraction wiring 142 of the flexible board 141 so as to form a conducting circuit with the anode-side extraction electrode 112P of the light-emitting unit 112.

Similarly, the light-emitting unit 113 is also connected to the extraction wiring 142 of the flexible board 141 in such a manner that the anode-side extraction electrode 113P is electrically connected to the cathode-side extraction electrode 112N of the light-emitting unit 112. The cathode-side extraction electrode 113N is so connected that it can be connected to a power source (not shown). Other parts of the organic EL module are formed by the methods described above.

The emission luminance of the prepared organic EL module was measured with a spectroradiometer CS-1000 (manufactured by Konica Minolta, Inc.). As a result, it was demonstrated that among the different emission luminances of the three light-emitting units, the lowest emission luminance was at least 80% of the highest emission luminance.

In this regard, it has been found that when a plurality of light-emitting units have different emission luminances with the lowest emission luminance being at least 80% of the highest emission luminance, the organic EL module with such units can work without causing the user to visually notice variations in luminance.

Therefore, since the light-emitting units are electrically connected in series, a constant current flows through them with an adjusted constant resistance, so that light emission can be observed with no variations in luminance at low power consumption.

Therefore, power consumption and variations in luminance can be kept small even when different luminescent materials (luminescent compounds) are used.

This embodiment shows a case where the light-emitting regions of a plurality of light-emitting units emit light of different colors. Alternatively, a plurality of light-emitting units may emit the same color. Even in such a case, the design method of this embodiment may also be used to design icon display regions if different organic EL elements are used to form light-emitting units with different resistances.

In addition, a plurality of light-emitting units may be electrically connected in parallel. When a plurality of light-emitting units are connected in parallel, the light-emitting units can be each independently controlled.

Embodiment 2

«Case where Icon Display Regions have the Same Area»

In general, conventional icon display regions often do not have the same light-emitting area. In other words, if formed depending on the shapes of the respective icons, light-emitting regions can have different light-emitting areas.

For example, as shown in FIG. 4A, an information device has an arrow button 211, a home button 212, and a menu button 213 as software buttons with an area ratio of 1.25 (the arrow button 211):1.00 (the home button 212):1.30 (the menu button 213), in which the area of the home button 212 is normalized to 1. In this case, luminance varies among the software buttons.

When the organic EL elements used in the respective icon display regions are made of the same material (including a case where they have the same electrical resistance), the respective icon display regions should preferably have the same area, so that the current density of each icon display region can be easily controlled.

Therefore, in the organic EL module of the present invention, the smallest light-emitting region area is preferably at least 80% of the largest light-emitting region area among the light-emitting region areas of the plurality of light-emitting units.

When the smallest light-emitting region area is at least 80% of the largest light-emitting region area among the light-emitting region areas of the plurality of light-emitting units, variations in current density among the light-emitting units connected in series can be kept small, so that variations in luminance can also be kept small.

Figure 4B:
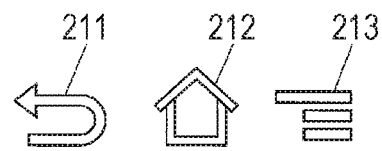
FIG. 4B is a schematic diagram showing exemplary icon display regions.

Specifically, using, as the reference, the home button with the smallest area in FIG. 4A, the arrow button 211, the home button 212, and the menu button 213 may be designed to have an area ratio of 1:1:1 (see FIG. 4B), so that they can have the same light-emitting area.

Figure 4C:
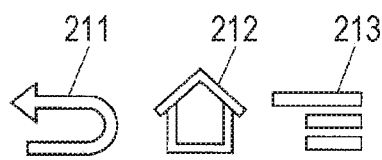
FIG. 4C is a schematic diagram showing exemplary icon display regions.

Alternatively, the arrow button 211, the home button 212, and the menu button 213 may be designed to have an area ratio of 1.3:1.3:1.3 (see FIG. 4C) using, as the reference, the icon display region with the largest area.

An organic EL module was prepared in the same manner as in Embodiment 1, except that the three icon display regions were formed to have the same area. The measurement of the luminance of the organic EL module shows that the lowest emission luminance is at least 80% of the highest emission luminance among the emission luminances of the three light-emitting units.

Therefore, since the light-emitting units are electrically connected in series, a constant current flows through them with the same area, so that their resistance can be easily controlled to a constant level and light emission can be achieved with no variations in luminance at low power consumption.

Therefore, power consumption and variations in luminance can be kept small also when the light-emitting regions (icon display regions) are designed to have a constant area.

Embodiment 3

«Case where a Dummy Light-Emitting Region is Provided in Addition to Each Icon Display Region»

When the areas of the icon display regions with different light-emitting areas are not able to be changed, a dummy light-emitting region may be provided in addition to the icon display region of each light-emitting unit.

Figure 4D:
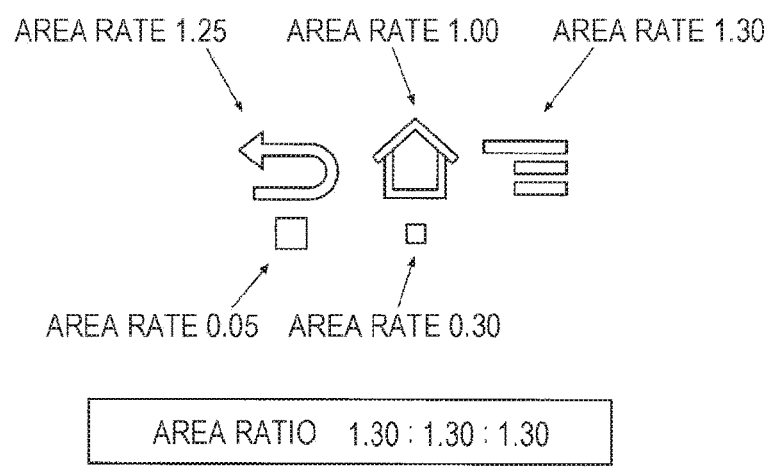
FIG. 4D is a schematic diagram showing exemplary icon display regions having dummy light-emitting regions.

Specifically, as shown in FIG. 4D, the arrow button 211, the home button 212, and the menu button 213 have an area ratio of 1.25 (the arrow button 211):1.00 (the home button 212): 1.30 (the menu button 213), in which the area of the home button 212 is normalized to 1. In this case, dummy light-emitting regions may be provided to allow the largest menu button area to conform to the area of any other button, so that the areas can be adjusted to have the same rate.

For example, a dummy light-emitting region with an area rate of 0.05 may be formed in the light-emitting unit 111 having the arrow button 211 with an area rate of 1.25, so that the light-emitting unit 111 can have the same light-emitting area (with an area rate of 1.30) as the light-emitting unit 113 having the menu button 213.

Similarly, a dummy light-emitting region with an area rate of 0.30 may be formed in the light-emitting unit 112 having the home button 212 with an area rate of 1.00, so that the light-emitting unit 112 can have the same light-emitting area (with an area rate of 1.30) as the light-emitting unit 113 having the menu button 213.

Figure 4E:
FIG. 4E is a schematic diagram showing an example of a cover glass.

Under normal circumstances, however, the dummy light-emitting region does not need to generate light. Therefore, the dummy light-emitting region should preferably be made invisible to the user. Therefore, as shown in FIG. 4E, a cover glass is preferably provided, which has printed patterns corresponding to the patterns of the plurality of icon display regions.

It will be understood that also in Embodiments 1 and 2, such a cover glass may be provided to make the emitted light more clearly visible.

An organic EL module was prepared in the same manner as in Embodiment 1, except that dummy light-emitting regions were formed as described above so that the three icon display regions were formed to have the same area. The measurement of the luminance of the organic EL module shows that the lowest emission luminance is at least 80% of the highest emission luminance among the emission luminances of the three light-emitting units.

Therefore, since the light-emitting units are electrically connected in series, a constant current flows through them with the same area, so that their resistance can be easily controlled to a constant level and light emission can be achieved with no variations in luminance at low power consumption.

Therefore, power consumption and variations in luminance can be kept small also when the light-emitting regions (icon display regions) are designed to have a constant area.

INDUSTRIAL APPLICABILITY

The present invention makes it possible to obtain an organic electroluminescence module having light-emitting units capable of keeping power consumption low. Such an organic EL module is suitable for use as a light source in a wide range of applications such as display devices, displays, home lighting, vehicle interior lighting, backlights for clocks or watches and liquid crystal displays, signboards, signals, optical information media, electrophotographic copiers, optical communication processing machines, optical sensors, and common home electric appliances requiring display devices.

REFERENCE SIGNS LIST

100 Information device
101 Organic EL module
102 Liquid crystal display screen
104 Cover glass
105 Liquid crystal display panel
107A, 107B Electrical connection unit
108 Printed circuit board
109 Case
111, 112, 113 Light-emitting unit
211, 212, 213 Light-emitting region (icon display region)
300 Organic EL element

The invention claimed is:

1. An organic electroluminescence module comprising: a plurality of light-emitting units that are electrically connected to one another and each have a light-emitting region corresponding to a design to be displayed by light emission, wherein the light-emitting region of at least one of the plurality of light-emitting units further comprises a dummy light-emitting region in addition to an icon display region, and the icon display region and the dummy light-emitting region have a total area equal to the area of the light-emitting region of one of other light-emitting units.

2. The organic electroluminescence module according to claim 1, wherein the plurality of light-emitting units include a light-emitting unit with a lowest emission luminance and a light-emitting unit with a highest emission luminance, and the lowest emission luminance is at least 80% of the highest emission luminance.

3. The organic electroluminescence module according to claim 2, further comprising a cover glass having printed patterns corresponding to patterns of the icon display regions.

4. The organic electroluminescence module according to claim 2, wherein the plurality of light-emitting regions are formed by batch patterning with light at a specific wavelength.

5. The organic electroluminescence module according to claim 2, wherein the plurality of light-emitting units are electrically connected in series.

6. An information device comprising the organic electroluminescence module according to claim 2.

7. An information device comprising a main display screen and at least one sub display screen, wherein the sub display screen comprises the organic electroluminescence module according to claim 2 as a component.

8. The organic electroluminescence module according to claim 2, wherein the plurality of light-emitting units include a light-emitting unit with a smallest area of light-emitting region and a light-emitting unit with a largest area of light-emitting region, and the smallest area is at least 80% of the largest area.

9. An information device comprising the organic electroluminescence module according to claim 1.

10. An information device comprising a main display screen and at least one sub display screen, wherein the sub display screen comprises the organic electroluminescence module according to claim 1 as a component.

11. The organic electroluminescence module according to claim 1, wherein the plurality of light-emitting units include a light-emitting unit with a smallest area of light-emitting region and a light-emitting unit with a largest area of light-emitting region, and the smallest area is at least 80% of the largest area.

12. The organic electroluminescence module according to claim 2, wherein the light-emitting regions of the plurality of light-emitting units are icon display regions.

13. The organic electroluminescence module according to claim 11, wherein the light-emitting regions of the plurality of light-emitting units are icon display regions.

14. The organic electroluminescence module according to claim 11, further comprising a cover glass having printed patterns corresponding to patterns of the icon display regions.

15. The organic electroluminescence module according to claim 11, wherein the plurality of light-emitting regions are formed by batch patterning with light at a specific wavelength.

16. The organic electroluminescence module according to claim 1, wherein the light-emitting regions of the plurality of light-emitting units are icon display regions.

17. The organic electroluminescence module according to claim 1, further comprising a cover glass having printed patterns corresponding to patterns of the icon display regions.

18. The organic electroluminescence module according to claim 1, wherein the plurality of light-emitting regions are formed by batch patterning with light at a specific wavelength.

19. The organic electroluminescence module according to claim 1, wherein the plurality of light-emitting units are electrically connected in series.

* * * * *